(12) United States Patent
Nosho et al.

(10) Patent No.: US 11,094,736 B1
(45) Date of Patent: Aug. 17, 2021

(54) DEVICE AND METHOD FOR REDUCING CRACKING OF MATERIAL DUE TO THERMAL MISMATCH

(71) Applicant: HRL LABORATORIES LLC, Malibu, CA (US)

(72) Inventors: Brett Z. Nosho, Santa Monica, CA (US); Pierre-Yves Delaunay, Santa Monica, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/933,797

(22) Filed: Nov. 5, 2015

Related U.S. Application Data

(60) Provisional application No. 62/077,092, filed on Nov. 7, 2014.

(51) Int. Cl.
| | |
|---|---|
| *H01L 27/146* | (2006.01) |
| *H01L 31/0304* | (2006.01) |
| *H01L 31/109* | (2006.01) |
| *H01L 31/10* | (2006.01) |
| *H01L 31/101* | (2006.01) |
| *H01L 31/18* | (2006.01) |
| *H01L 31/0232* | (2014.01) |
| *H01L 31/102* | (2006.01) |

(52) U.S. Cl.
CPC ...... *H01L 27/1465* (2013.01); *H01L 27/1461* (2013.01); *H01L 31/0304* (2013.01); *H01L 31/109* (2013.01)

(58) Field of Classification Search
CPC . H01L 31/02016; H01L 31/109; H01L 31/11; H01L 27/1465; H01L 29/157; H01L 31/101
USPC .............................. 257/189, 749; 438/73, 74
See application file for complete search history.

(56) References Cited

U.S. PATENT DOCUMENTS

| | | | |
|---|---|---|---|
| 5,227,656 A | 7/1993 | Timlin et al. | |
| 7,723,815 B1 * | 5/2010 | Peterson | H01L 24/26 257/442 |
| 2008/0073743 A1 * | 3/2008 | Alizadeh | B82Y 10/00 257/461 |
| 2008/0111152 A1 * | 5/2008 | Scott | H01L 31/035281 257/188 |
| 2008/0217717 A1 * | 9/2008 | Pfister | H01L 27/1469 257/443 |
| 2010/0038539 A1 * | 2/2010 | Endres | H01L 27/14636 250/332 |
| 2011/0042772 A1 * | 2/2011 | Hampp | H01L 23/3114 257/443 |
| 2013/0062593 A1 * | 3/2013 | Jones | H01L 31/035236 257/21 |
| 2015/0179844 A1 * | 6/2015 | Ergun | H01L 21/02398 257/21 |

\* cited by examiner

*Primary Examiner* — Omar F Mojaddedi
(74) *Attorney, Agent, or Firm* — Lewis Roca Rothgerber Christie, LLP

(57) ABSTRACT

A device and method of manufacturing are disclosed. The device contains a buffer layer containing a first material, a detector structure disposed above the buffer layer, a readout integrated circuit coupled with the detector structure, a layer above the readout integrated circuit comprising a second material, and a silicon layer above the layer.

12 Claims, 4 Drawing Sheets ial Application No. 62/077,092, filed on Nov. 7, 2014, which is incorporated herein by reference in its entirety.

DEVICE AND METHOD FOR REDUCING CRACKING OF MATERIAL DUE TO THERMAL MISMATCH

CROSS REFERENCE TO RELATED APPLICATIONS

This application claims the benefit of U.S. Provisional Application No. 62/077,092, filed on Nov. 7, 2014, which is incorporated herein by reference in its entirety.

STATEMENT REGARDING FEDERALLY SPONSORED RESEARCH OR DEVELOPMENT

The present invention was made with support from the United States Government under Grant number W909MY-11-C-0025 awarded by the Vital Infrared Sensor Technology Acceleration Program (VISTA). The United States Government has certain rights in the invention.

FIELD

The present invention relates to readout integrated circuits.

BACKGROUND

Prior art has primarily focused on using metal balanced composite structure (BCS) for thermal matching. This has been shown to be a sufficient solution for HgCdTe and InSb over the years.

For HgCdTe, metal BCS is commonly used, and has been developed over decades of work. For InSb, manufacturers favor smaller format Focal Plane Arrays (FPAs) that are planar based, making thermal mismatch more tolerable. For larger FPAs, a similar planar approach is commonly used, or an entirely different approach that fully separates all pixels and uses a metal interconnect grid for the common side as described in U.S. Pat. No. 5,227,656 incorporated herein in its entirety. It is not known what the limit of pixel size will ultimately be for this process, as well as what type of transmission losses may be suffered due to the bond layer between silicon and the residual epi material. Many bonding agents exhibit some IR absorption, particularly at longer wavelengths.

Traditional approaches for using a BCS to shim readout integrated circuits (ROICs) typically use metals such as titanium or stainless steel. In the case of HgCdTe, there are also some references to using germanium. As known in the art, the BCS core material is empirically tuned to provide an average thermal match over the desired temperature range. For traditional approaches that use dissimilar materials for the BCS core material and the epitaxial material, the average CTE may match or the final linear displacement may match, but there may be significant deviations over the temperature range due to the fundamental differences in CTE. Furthermore, it is difficult to maintain a good thermal match using traditional approaches from cryogenic materials to elevated temperatures such as 100° C.

Presently disclosed embodiments overcome the limitations of the prior art.

In the following description, like reference numbers are used to identify like elements. Furthermore, the drawings are intended to illustrate major features of exemplary embodiments in a diagrammatic manner. The drawings are not intended to depict every feature of every implementation nor relative dimensions of the depicted elements, and are not drawn to scale.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings. In addition, the terms "connected" and "coupled" and variations thereof are not restricted to physical or mechanical connections or couplings.

According to some embodiments, a process presently disclosed is for shimming readout integrated circuits (ROICs) to infrared detector focal plane arrays based on III-V materials. According to some embodiments, presently disclosed methodology allows fabricating focal plane arrays using a combination of device structure design and a balanced composite structure (BCS) incorporating, for example, GaSb substrates for FPAs based on strained-layer superlattices with high aspect ratio mesa isolation etches. By matching the primary shim material in the BCS with the thick remaining material on the array side, presently disclosed embodiments are able to achieve a wide range of thermal match between the epi-material and the BCS stack.

Contrary to the prior art, the BCS stack presently disclosed comprise core material that is the same as the primary remaining layer used in the epitaxial material. According to some embodiments presently disclosed, the thermal expansion of the BCS stack closely tracks that of the pure core material, resulting in a good thermal match over a wide temperature range.

According to some embodiments presently disclosed, a balanced composite structure (BCS) is used to shim a readout integrated circuit (ROICs) to an infrared detector focal plane.

Figure 1:
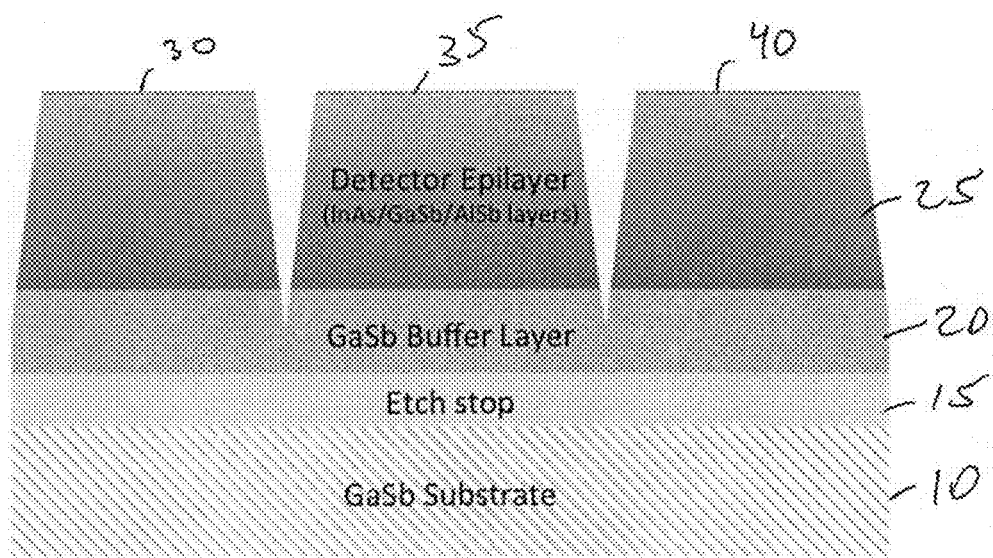
FIG. 1 depicts an embodiment according to the present disclosure.

According to some embodiments, a substrate 10 is provided as shown in FIG. 1. According to some embodiments, the substrate 10 comprises GaSb material. According to some embodiments, a buffer layer 20 is grown above the substrate 10 as shown in FIG. 1. In some embodiments, the buffer layer 20 comprises GaSb material. According to some embodiments, an etch stop layer 15 is formed between the buffer layer 20 and the substrate 10.

According to some embodiments, a detector structure 25 is grown above the buffer layer 20 as shown in FIG. 1. According to some embodiments, the detector structure 25 comprises InAs/GaSb/AlSb layers.

According to some embodiments, one or more mesas are defined in the detector structure 25 followed by an isolation etch to separate, for example, pixels 30, 35, 40. According to some embodiments, the isolation etch can be as deep as into the buffer layer 20. According to some embodiments, the buffer layer 20 serves as the common contact. According to some embodiments, the isolation etch stops within the detector structure 25.

Figure 2:
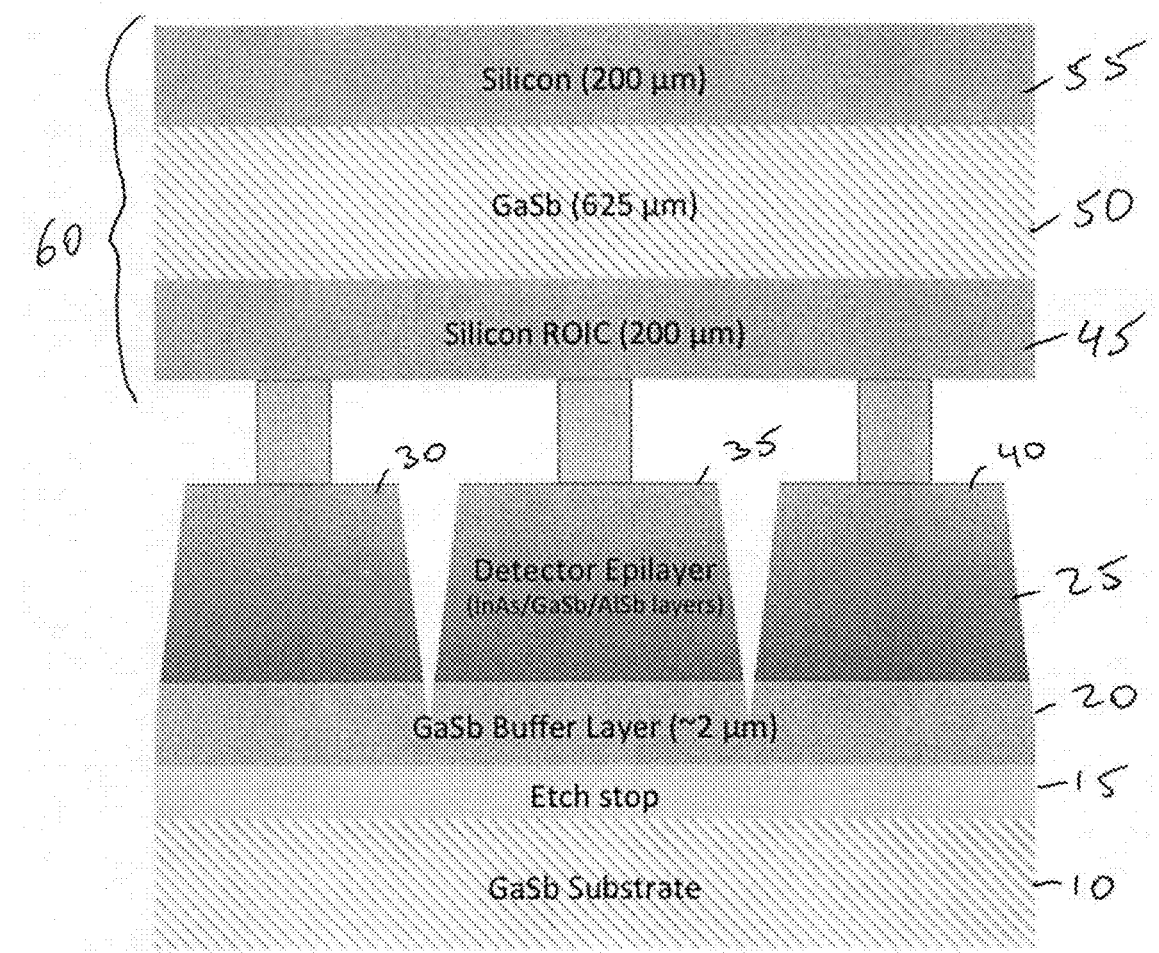
FIG. 2 depicts another embodiment according to the present disclosure.

According to some embodiments, the array with defined mesas 30, 35, 40 is hybridized to a readout integrated circuit (ROIC) 45 as shown in FIG. 2. According to some embodiments, the ROIC 45 comprises silicon. According to some embodiments, a balanced composite structure (BCS) 60 is formed by providing the ROIC 45, bonding on a layer 50, and then bonding on an additional piece of silicon layer 55. According to some embodiments, the ROIC 45 is about 200 µm thick. In various embodiments, the ROIC 45 may be between 100 µm and 200 µm thick, and may be thicker in some embodiments. According to some embodiments, the layer 50 comprises GaSb material. According to some embodiments, the layer 50 is about 625 µm thick. In various embodiments, the layer 50 may be between 300 µm and 700 µm thick. According to some embodiments, the silicon layer 55 is about 200 µm thick. In various embodiments, the silicon layer 55 may be between 100 and 200 µm, or between 50 and 300 µm. The thicknesses of the ROIC 45 and the silicon layer 55 may be the same to improve balance for the structure, but they may be different thicknesses in various embodiments. According to some embodiments, the layer 50 and the silicon layer 55 are bonded together by spinning on an epoxy and then cured. Spinning the epoxy on may create a uniform coverage and thickness between the BCS components.

According to some embodiments, the ROIC 45 is thinned to about 50 µm to 200 µm thick either before or after hybridization with the detector structure 25.

According to some embodiments, the ROIC 45 is hybridized with the detector structure 25 at a room temperature of about 21° C. According to some embodiments, the ROIC 45 is hybridized with the detector structure 25 at a temperature higher than room temperature (e.g., between 21° C. and 50° C.). Higher temperatures during hybridization may result in softer Indium bumps and better connectivity and rigidity. According to some embodiments, the Coefficient of Thermal Expansion (CTE) mismatch between the BCS 60 and the detector array 25 are very well matched as the hybrid part may experience an extended range of temperature variation from about +100° C. down to cryogenic temperatures.

GaSb substrates have varying levels of free-carrier absorption of infrared radiation. As a result, according to some embodiments presently disclosed, the GaSb substrate 10 is reduced in thickness. According to some embodiments, the GaSb substrate 10 is about 0 µm to 100 µm thick. According to some embodiments, the GaSb substrate 10 is 20-50 µm thick, or between 50 and 100 µm thick. According to some embodiments, the GaSb substrate 10 is removed completely. According to some embodiments, the GaSb substrate is removed utilizing a dry etch process that is highly selective to stop on the etch stop layer 15.

According to some detector architectures, and in particular for some molecular beam epitaxy (MBE) systems, it may not be feasible or practical to grow a thick GaSb buffer layer 20 that is also a contact. For example, if an n-type bottom contact is required, GaSb can only be used if doped with Te. The materials for III-V based detectors such as InAs/GaSb superlattices and InAsSb (Sb-8% or a little higher) are expected to behave in a similar manner to GaSb and would likely work a similar manner with a GaSb-based BCS.

Figure 3:
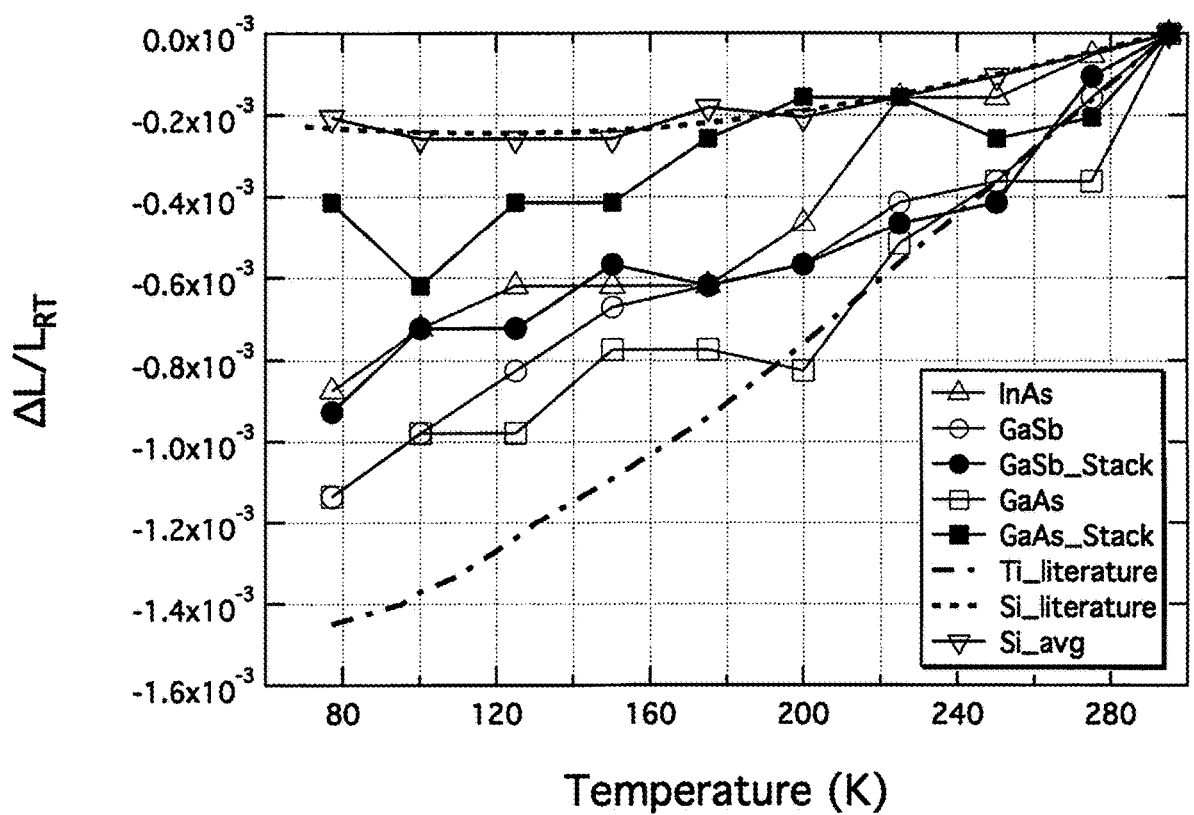
FIG. 3 depicts measured linear expansions for various materials.

In evaluating different possibilities for fabricating BCS for detectors based on superlattice structures, InAs, GaSb, and GaAs materials were considered as the core material (e.g., layer 50) for the shim. FIG. 3 depicts normalized total displacement with respect to room temperature for different materials.

As shown in FIG. 3, the InAs, GaSb, and GaAs materials have similar displacements with temperature within the experimental measurements. Since InAs exhibits less displacement with temperature than GaSb, we chose to continue with GaSb and GaAs as the goal it to match to GaSb. The linear expansion data from a BCS stack made using a GaSb substrate is shown in FIG. 3. As can be seen, the measured change of the stack is nearly identical to that of the bulk GaSb, indicating that the thinner silicon is effectively forced to match GaSb.

Figure 4A:
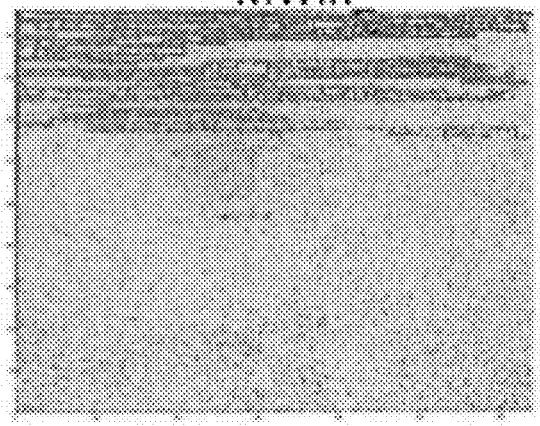
FIGS. 4a-b and 5a-b depict spatial maps.
Figure 4B:
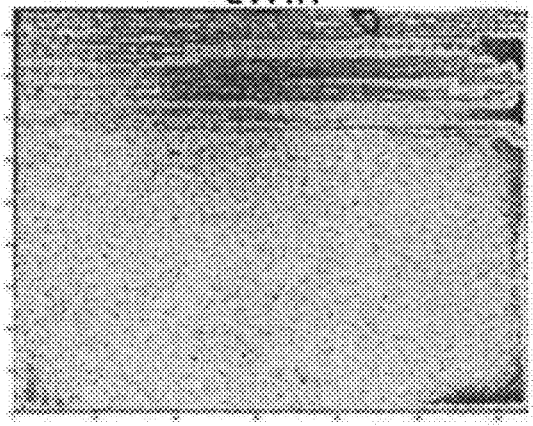
Figure 5A:
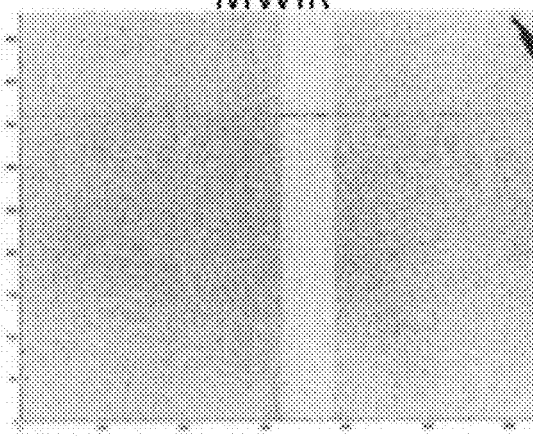
Figure 5B:
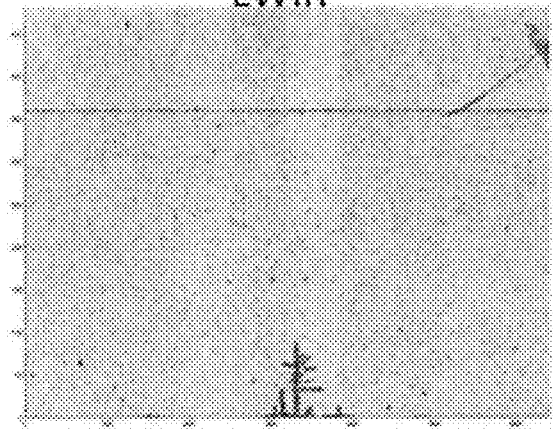

To contrast the difference when using currently described process, typical NEDT data from an FPA at 20 µm pitch are shown in FIGS. 4*a-b* when no BCS is used, and a different FPA is shown in FIGS. 5*a-b* when a GaSb BCS is used as presently disclosed. A similar etch depth was used for both FPAs, and both parts were passivated, underfilled with the same epoxy and the GaSb substrate removed in both cases. The mesas were isolated in both cases to the bottom thick GaSb buffer/contact layer. As can be seen in FIGS. 4*a-b* in the top of the images, the lines that appear in the top of the images are results of cracking in the material leading to degraded performance.

According to some embodiment, the shim layer comprises GaSb material and the substrate 10 is 100 µm or thicker. According to some embodiments, the shim layer comprises GaSb material and the substrate 10 is completely removed. According to some embodiments, the shim layer comprises InAs or GaAs material.

While several illustrative embodiments of the invention have been shown and described, numerous variations and alternative embodiments will occur to those skilled in the art. Such variations and alternative embodiments are contemplated, and can be made without departing from the scope of the invention as defined in the appended claims.

As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

The foregoing detailed description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied there-from. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "step(s) for. . . . "

What is claimed is:

1. A device comprising:
   a buffer layer comprising a first material;
   a detector structure disposed above the buffer layer;
   a readout integrated circuit coupled with the detector structure;
   a layer above the readout integrated circuit comprising a second material; and
   a silicon layer above the layer,
   wherein the detector structure comprises a plurality of mesas, and
   wherein the buffer layer is a common contact for the plurality of mesas.

2. The device of claim 1, wherein the first material and the second material are the same.

3. The device of claim 1, wherein the first material comprises GaSb material, and the second material comprises GaSb.

4. The device of claim 1, wherein the first material comprises GaSb material, and the second material comprises InAs.

5. The device of claim 1, wherein the first material comprises GaSb material, and the second material comprises GaAs.

6. The device of claim 1, wherein the detector structure comprises InAs/GaSb/AlSb layers.

7. The device of claim 1, wherein the layer comprises GaSb material.

8. A method comprising:
   providing a substrate;
   growing a buffer layer above the substrate, wherein the buffer layer comprises a first material;
   growing a detector structure above the buffer layer;
   coupling a readout integrated circuit with the detector structure;
   forming a layer above the readout integrated circuit comprising the first material; and
   forming a silicon layer above the layer, the layer is coupled with the silicon layer by spinning and curing an epoxy material.

9. The method of claim 8, further comprising:
   forming an etch stop layer between the substrate and the buffer layer.

10. The method of claim 8, further comprising:
    etching one or more mesas in the detector structure.

11. The method of claim 8, the readout integrated circuit is coupled with the detector structure at room temperature.

12. The method of claim 8, the readout integrated circuit is coupled with the detector structure at temperature higher than room temperature.

* * * * *